United States Patent
Wada et al.

[11] Patent Number: 5,879,576
[45] Date of Patent: Mar. 9, 1999

[54] METHOD AND APPARATUS FOR PROCESSING SUBSTRATES

[75] Inventors: Kenya Wada; Kazuhiko Gonmori, both of Ninomiya-machi; Hisayoshi Ichikawa, Minami-ashigara; Nobuo Morita, Hadano; Hiroshi Fukuda, Odawara, all of Japan

[73] Assignee: Hitachi Electronics Engineering Co., Ltd., Tokyo, Japan

[21] Appl. No.: 852,291

[22] Filed: May 7, 1997

[30] Foreign Application Priority Data

May 7, 1996 [JP] Japan .................................. 8-135706

[51] Int. Cl.[6] ...................................................... B44C 1/22
[52] U.S. Cl. ................................ 216/91; 156/345; 216/92
[58] Field of Search ......................... 156/345 L, 345 LS; 216/90, 91, 92, 23; 438/747, 748

[56] References Cited

U.S. PATENT DOCUMENTS

| | | | |
|---|---|---|---|
| 4,350,562 | 9/1982 | Bonu | 156/345 X |
| 4,788,994 | 12/1988 | Shinbara | 156/345 X |
| 4,903,717 | 2/1990 | Sumnitsch | 156/345 X |
| 5,308,447 | 5/1994 | Lewis et al. | 216/92 X |

*Primary Examiner*—William Powell
*Attorney, Agent, or Firm*—Oblon, Spivak, McClelland, Maier & Neustadt, P.C.

[57] ABSTRACT

Method and apparatus for processing substrates through a number of wet treatments. A substrate is set on a substrate rotating means for rotation in a horizontal face-up position, within a housing which is open on its top side. By a treating liquid feed means having a treating liquid feed nozzle member, at least one kind of treating liquid is supplied onto upper surfaces of the substrate being rotated by the substrate rotating means. The treating liquid feed nozzle member is supported on a movable arm for displacement to and from an operative position vertically confronting the substrate and a receded standby position away from the substrate on the substrate rotating means. Located face to face with lower surfaces of the substrate is a nozzle means which supplies a fluid to the lower side of the substrate.

16 Claims, 9 Drawing Sheets

METHOD AND APPARATUS FOR PROCESSING SUBSTRATES

BACKGROUND OF THE INVENTION

1. Field of the Art

This invention relates to method and apparatus for processing surfaces of substrates such as TFT substrates of liquid crystal display panels or substrates of color filters, semiconductor wafers or the like through a plural number of wet treatments.

2. Prior Art

For instance, in a fabrication process of TFT substrates of liquid crystal display panels, the substrates are processed through various wet treatments including treatments with such liquids developing agent, etching agent and releasing or exfoliation agent in addition to washing and drying treatments. In processing substrates through a series of wet treatments of this nature, it has been well known in the art to apply a treating liquid on a rotating substrate which is mounted and supported on a rotating spindle. In a washing treatment, for example, substrates are subjected to the so-called megasonic shower in which ultrasonically vibrated pure water is showered on each substrate as a wash liquid, which is one of treating liquids as usually used in various stages of substrate processing.

In connection with the wet processing as mentioned above, it has been known in the art to use a single apparatus which is arranged to process substrates through a plural number of wet treatments such as application of a liquid developer and washing or rinsing with pure water, for example, from Japanese Laid-Open Patent Application H7-245466. The substrate processing apparatus by this laid-open application is arranged as shown in FIG. 11.

Figure 11:
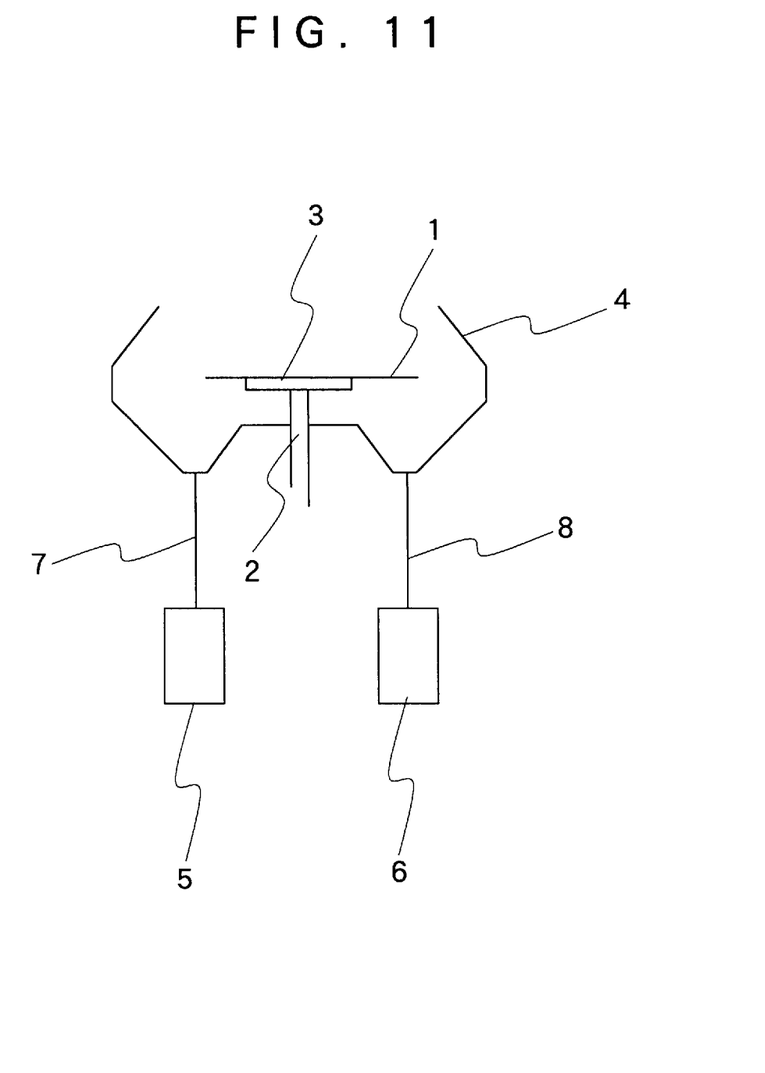
FIG. 11 is a schematic illustration of a substrate processing apparatus by prior art.

In FIG. 11, indicated at 1 is a substrate which is fixed in a predetermined position on a holder plate 3 which is supported on a spindle 2. Denoted at 4 is a cup-like housing which is positioned in such a manner as to circumvent the substrate 1 on the spindle 2. Although not shown in the drawing, a liquid developer feed nozzle and a pure water feed nozzle are located over the substrate 1. The just-mentioned liquid developer and pure water feed nozzles can be turned into and out of an operative position over an opening on the upper side of the housing 4 and a receded or standby position away from the top opening of the housing 4.

While holding the developer and pure water feed nozzles in the respective standby positions, the substrate 1 is set in position on the spindle 2 by means of a substrate handling mechanism. Then, the liquid developer feed nozzle is positioned in the operative position vertically in face to face relation with the substrate 1 through the opening on the top side of the housing 4, and a liquid developer is poured onto upper surfaces of the substrate 1 which is put in high speed rotation by the spindle 2. The liquid developer which has been supplied onto the substrate 1 is spread and diffused radially outward along upper surfaces of the substrate 1 under the influence of centrifugal force. As a consequence, the liquid developer is coated on the entire surfaces of the substrate 1 in the form of a thin film of substantially uniform thickness. At this time, excess liquid developer is shaken off from outer peripheral portions of the substrate 1 and scattered in radially outward directions. In a washing or rinsing stage subsequent to the application of a liquid developer, the liquid developer feed nozzle is moved into a receded standby position, and instead the pure water feed nozzle is advanced into the operative position over the opening on the top side of the housing 4. In this washing stage, similarly to the application of a liquid developer, pure water is poured onto upper surface of the substrate 1 from the pure water feed nozzle, letting pure water spread substantially over the entire upper surfaces of the substrate 1 under the influence of centrifugal force for washing the developer-coated surfaces.

In this connection, each one of the liquid developer and pure water, which has been poured onto the substrate 1, is shaken off and scattered radially outward from peripheral regions of the substrate 1, and splashes of the liquid flow down along the inner surfaces of the housing 4 and collected at its bottom for recovering same. In this case, in order to recover the liquid developer and pure water separately, two recovery tanks 5 and 6 are connected to the processor through suction pipes 7 and 8, respectively. The suction pipe 7 is put in operation during application of the liquid developer to recover the excess liquid developer into the tank 5 through the bottom of the housing 4, while the suction pipe 8 is put in operation in the washing stage to recover spent wash liquid into the tank 6.

As mentioned above, the liquid developer which has been supplied onto upper surfaces of the substrate is caused to spread and scatter in radially outward directions under the influence of centrifugal force. At this time, there are possibilities of splashes of outwardly scattered developer liquid getting around onto the lower side of the substrate or mist of the liquid developer depositing on the lower side of the substrate. In the case of TFT substrates, deposition of the developer liquid on the back side of the substrate will result in detrimental defects of the end products. Accordingly, during a treatment with a liquid of this nature, it is a paramount requisite to protect the lower side of each substrate against splashes or mist of the treating liquid. Nevertheless, there have not been known any protective measures which can be effectively applied to a wet process as described above. Besides, in a spin drying stage following a washing treatment, the substrate is dried by putting same in high speed rotation after stopping supply of a wash liquid, but on such occasions difficulties are often experienced in uniformly drying up the entire surfaces of the washed substrate due to difference in circumferential speed between central and peripheral regions of the substrate, in addition to air circulation which is induced within a housing of a processing apparatus toward the center of rotation of the substrate where vacuum pressure is developed as a result of rotation of the substrate, causing floating mist of a treating liquid to deposit on once-dried surfaces of the substrate.

SUMMARY OF THE INVENTION

In view of the foregoing situations, it is an object of the present invention to provide method and apparatus for processing substrates through wet treatments as mentioned above, which can treat substrate surfaces accurately with a treating liquid without permitting the latter to get around and deposit on the back side of each substrate.

It is another object of the present invention to provide substrate processing method and apparatus of the sort as mentioned above, which can efficiently and accurately carry out a process involving a series of wet treatments with a liquid developer, an etching agent and an exfoliation liquid, in combination with washing and spin drying of substrates as required subsequent to a wet treatment.

It is a further object of the present invention to provide substrate processing method and apparatus of the sort as mentioned above, which can uniformly and efficiently dry not only front side but also back side of a substrate in a spin drying stage.

According to the present invention, the above-stated objectives are achieved by the provision of: a substrate rotating means arranged to hold and rotate a substrate in a horizontal face-up position; a treating liquid feed means having a treating liquid feed nozzle member for supplying at least one kind of treating liquid onto upper surfaces of the substrate being rotated by the substrate rotating means, the nozzle member being supported on a movable arm for displacement to and from an operative position vertically confronting the substrate and a receded standby position away from the substrate on the substrate rotating means; and a nozzle means for supplying a fluid to lower surfaces of the substrate.

In the wet processing, the substrate is applied and treated with at least one treating liquid or solution selected from developing agent, etching agent and release or peeling agent, and preferably applied and treated with at least one treating liquid or solution selected from developing agent and etching agent and release agent, in addition to a wash liquid, and processed through at least three treating stages of application of treating liquid, washing or rinsing and spin drying. Accordingly, the treating liquid feed means is constituted by a first treating liquid feed means for supplying one of developing agent, etching agent and release agent, and a second treating liquid feed means for supplying a wash liquid. Further, a dry gas feed means may be added to supply a dry gas toward the center of rotation of the substrate, employing a dry gas feed nozzle which is arranged to oscillate along a predetermined locus of movement passing through the center of rotation of the substrate.

Further, according to the present invention, there is provided a method for processing a substrate through a number of wet treatments on a single processing apparatus, which method comprises the steps of: holding and putting a substrate in rotation in a horizontal face-up position on a vertical rotational shaft; feeding a treating liquid to upper surfaces of the substrate at the center of rotation thereof to coat the treating liquid in a film of a predetermined thickness over the entire upper surfaces of the substrate, while feeding pure water to lower surfaces of the substrate at or in the vicinity of the center of rotation to form a protective water film on the lower side of the substrate under the influence of centrifugal force; feeding pure water to the upper surfaces of the rotating substrate to wash the coated film of the treating liquid; and spin-drying the substrate by blasting dry gas on both upper and lower surfaces of the rotating substrate at the center of rotation of thereof.

BRIEF DESCRIPTION OF THE DRAWINGS

The above and other objects, features and advantages of the invention will become clear from the following particular description of the invention, taken in conjunction with the accompanying drawings which show by way of example some preferred embodiments of the invention and in which.

DESCRIPTION OF PREFERRED EMBODIMENTS

Figure 1:
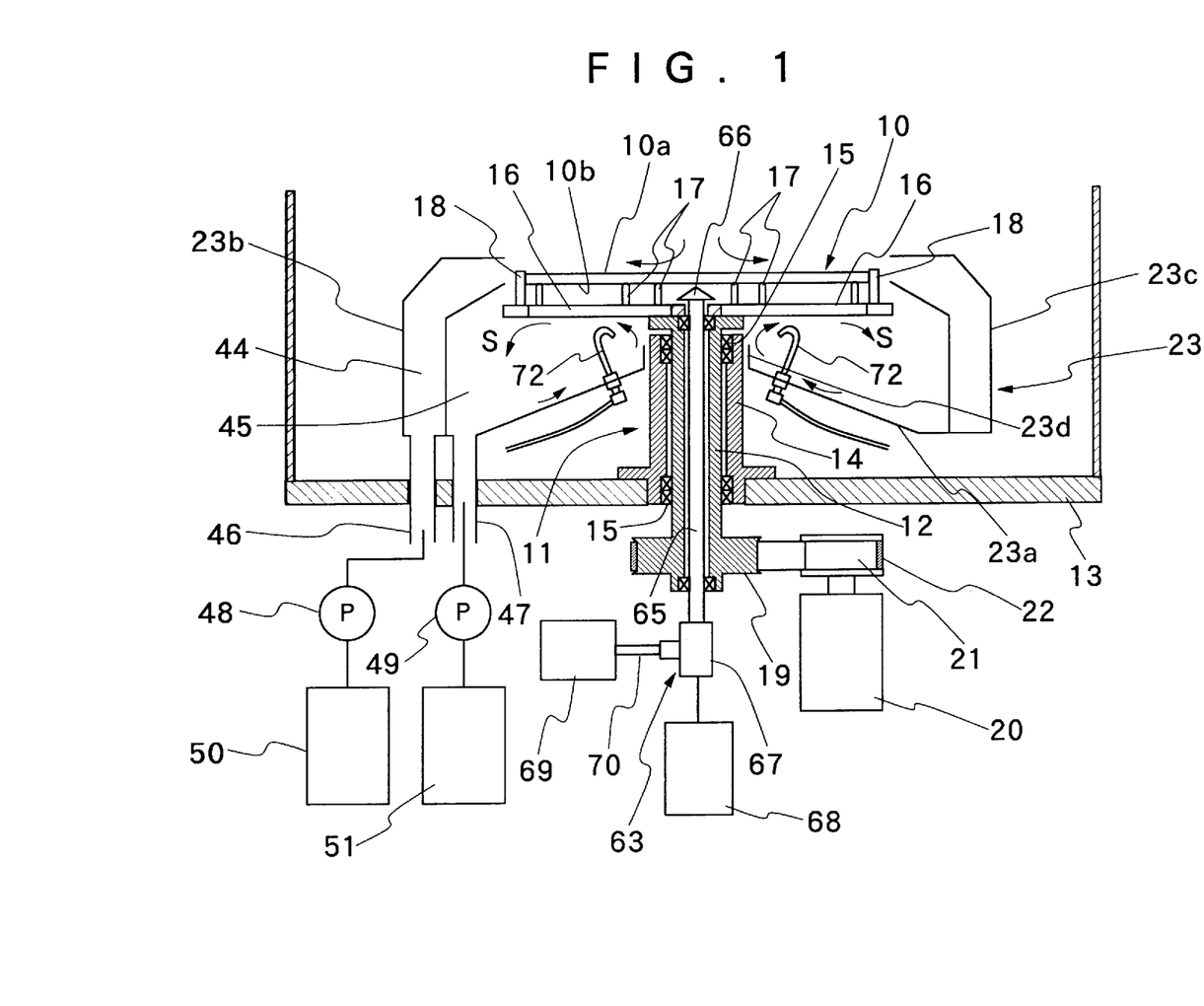
FIG. 1 is a schematic illustration of a substrate processing apparatus embodying the present invention.

Referring first to FIG. 1, there is shown general arrangement of a substrate processing apparatus embodying the present invention. In the following description, the present invention is shown by way of processing of TFT substrates of liquid crystal display panel, including treatments such as application or coating of a liquid developer, washing and spin drying. However, it is to be understood that the present invention can be similarly applied to wet processing of other types of substrates such as color filters of liquid crystal panels, semiconductor wafers and so forth, which involve applications of various treating liquids.

Figure 2:
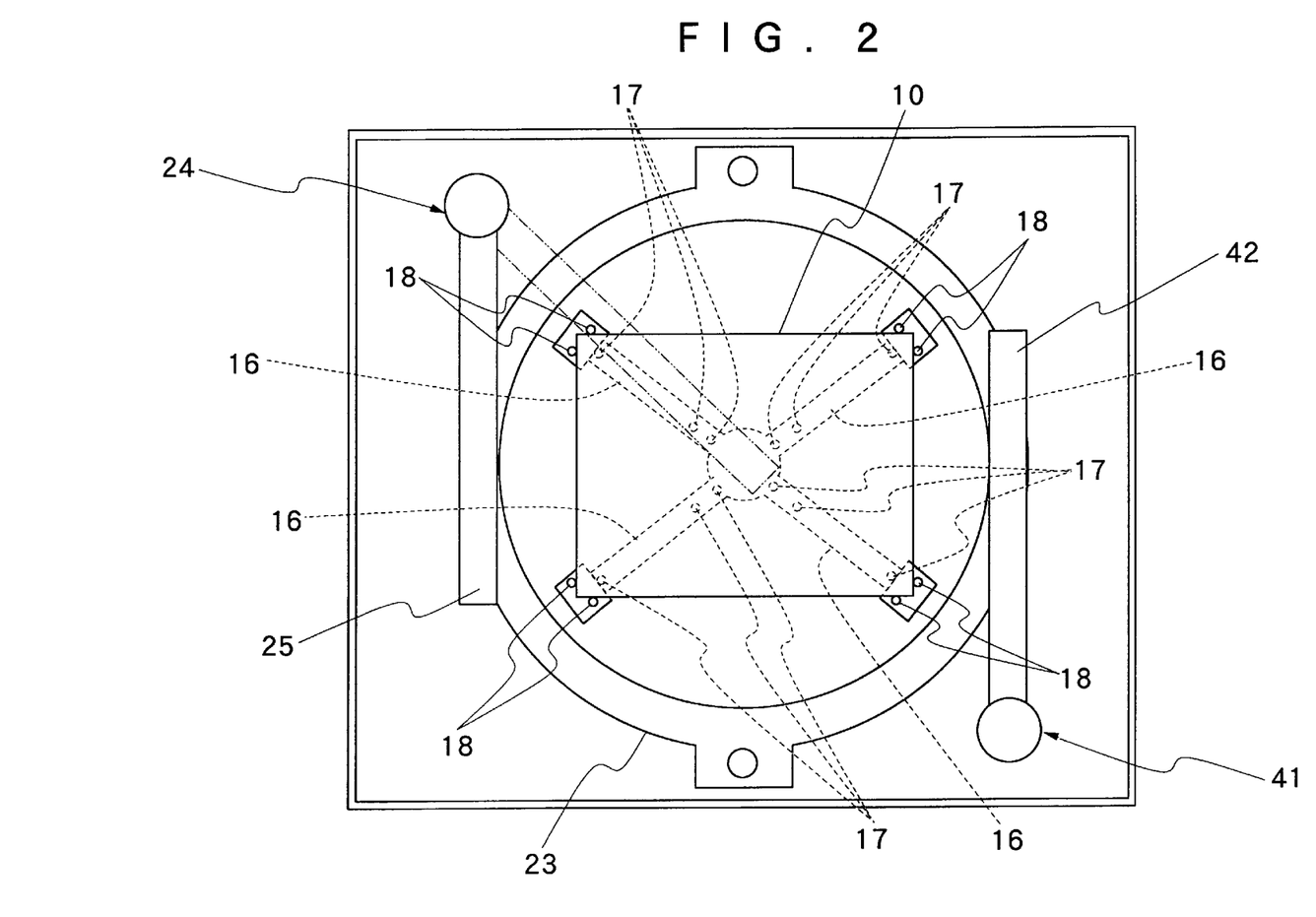
FIG. 2 is a schematic plan view of the apparatus of FIG. 1.

In FIG. 1, indicated at 10 is a substrate to be processed. As shown particularly in FIG. 2, the substrate 10 is in the form of a rectangular sheet of glass. Denoted at 11 is a substrate rotating means which has a hollow rotational shaft 12 rotatably supported through bearings 14 within a cylindrical sleeve-like retainer 14 which is erected on a base table 13. Mounted on top of the rotational shaft 12 are four arms 16 which are extended out in horizontal directions, respectively. A plural number of support studs 17 are planted on each one of the horizontal arms 16. Upper end of each stud 17 is rounded into a spherical shape. On the other hand, a pair of positioning studs 18 are planted on a fore end portion of each arm 16. Thus, the substrate 10 is placed and supported horizontally on a plural number of studs 17 by point contact with the latter, and retained in a predetermined position by the paired positioning studs 18 which are located at four corners of the substrate 10 in such a way as to restrict its movements in horizontal directions.

The rotational shaft 12 of the substrate rotating means 11 is extended downward through the base table 13 and provided with a pulley 19 at its lower end. Located beneath the base table 13 is a motor 20 which has its output shaft coupled with a drive pulley 21. A transmission belt 22 is wrapped around the drive pulley 21 and the pulley 19 at the lower end of the rotational shaft 12. Therefore, as the rotational shaft 12 is driven and put in rotation by the motor 20, the substrate 10 on the arms 16 is turned about the axis of the rotational shaft 12. While the substrate 10 is turned in this way, it is processed through a plural number of treatments including application of a liquid developer on the surfaces on the front side (upper side) of the substrate, rinsing or washing in megasonic shower, and high-speed spin drying.

In these wet treatments, since the substrate 10 is put in rotation, a supplied treating liquid, such as liquid developer or pure water, for example, is spread radially outward along surfaces on the upper or front side 10a of the substrate under the influence of centrifugal force. At the outer edges of the substrate 10, excess liquid is shaken off and scattered around substantially in horizontal directions. For the purpose of collecting the scattered excess liquid, the base table 10 is enclosed in a housing 23 which is provided with an opening on the top side. Located on the outer side of the housing 23 are feed means for a liquid developer and wash liquid such as ultrasonically vibrated pure water or the like, along with a nitrogen gas feed means. In this regard, arrangements may be made to supply liquid developer and pure water through separate feed means or to supply the liquid developer through an exclusive feed means while supply wash liquid and nitrogen gas through a common feed means.

Figure 3:
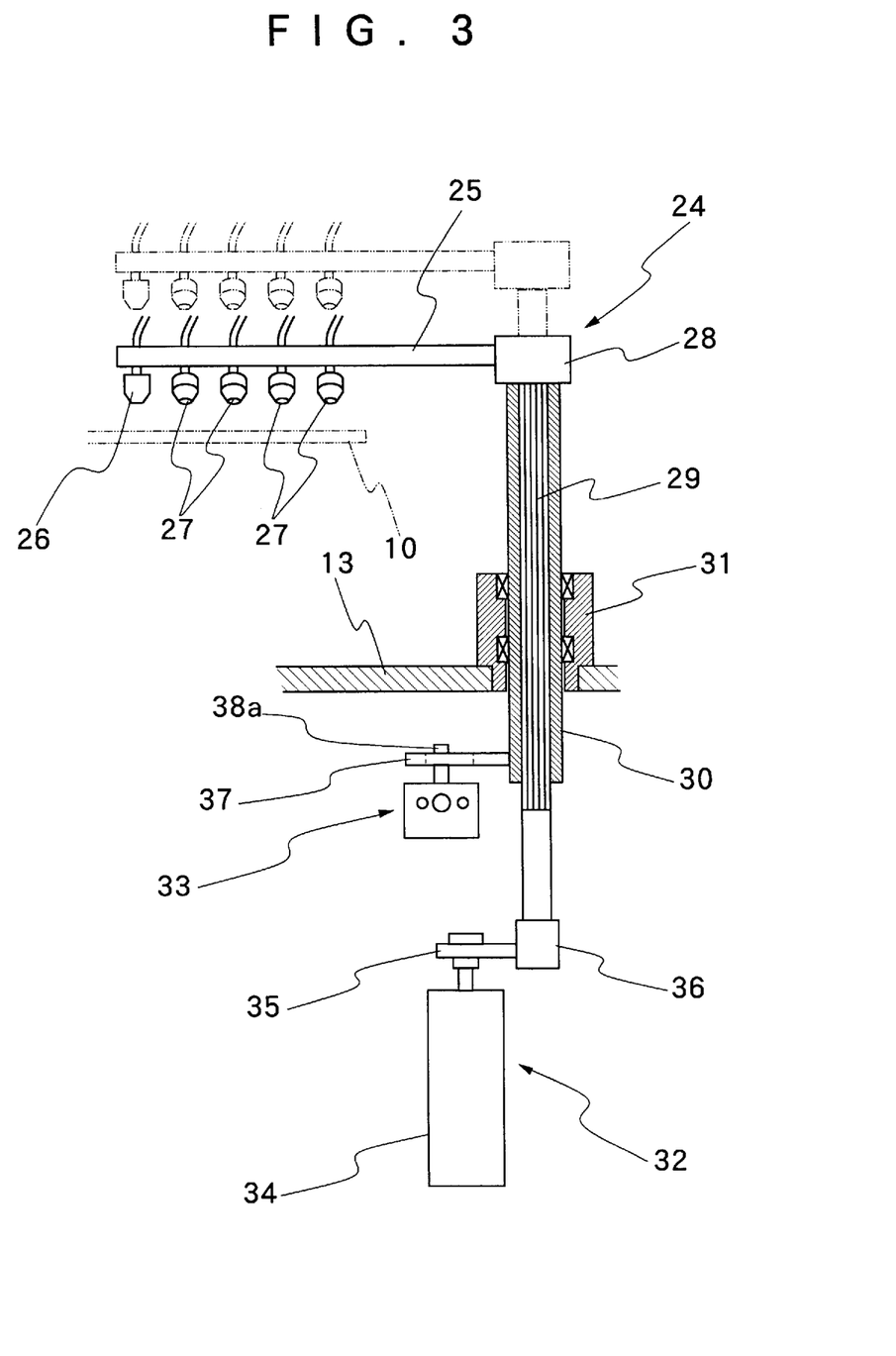
FIG. 3 is a sectional view of a first feed means.

Illustrated in FIG. 3 are arrangements of the first feed means 24 which serves to supply a developer and wash liquid. More specifically, the first feed means 24 is provided with a horizontally disposed support arm 25 carrying a developer feed nozzle 26 and a plural number of wash liquid feed nozzles 27. The support arm 25 has its base end portion connected to a support block 28 which is coupled with upper end of a spline shaft 29. The spline shaft 29 which is fitted in a hollow rotational shaft 30 is vertically movable independently of the rotational shaft 30 but rotationally locked with the latter. The rotational shaft 30 is rotatably supported in a bearing member 31 which is mounted on the base table 13.

Figure 4:
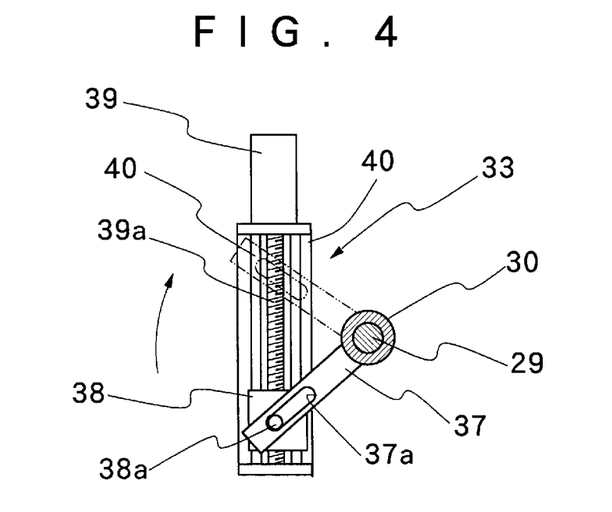
FIG. 4 is a schematic view of a rotational drive means.

The rotational shaft 30 is extended through and downward of the base table 13, and the lower end of the spline shaft 29 is extended further downward of the rotational shaft 30. The lower ends of the spline shaft 29 and rotational shaft 30 are coupled with a lift mechanism 32 and a rotational drive mechanism 33, respectively. The lift mechanism 32 includes a lift cylinder 34 having a rod connected to a link plate 35 which is relatively rotatably connected to the spline shaft 29 through a bearing 36. Accordingly, upon actuating the cylinder 34, the spline shaft 29 is moved between a lowered position indicated by solid line in FIG. 3 and an uplifted position indicated by imaginary line. As shown in FIG. 4, the rotational drive means 33 is provided with an actuator lever 37 which is securely fixed to the rotational shaft 30. This actuator lever 37 is formed with a slot 37a which extends in the longitudinal direction of the lever 37 and receives a drive pin 38a which is planted on a slide block 38. By a feed screw 39a which is driven by a motor 39, the just-mentioned slide block 38a is moved back and forth along guide rods 40. Thus, as the slide block 38 is moved, the actuator lever 37 is displaced in the arrowed directions, turning the rotational shaft 30 back and forth to move the first feed means between a receded standby position outside the housing 23 as indicated by solid line in FIG. 2 and an operative position over the top opening of the housing 23 as indicated by imaginary line in the same figure.

With the first feed means which is arranged as described above, the support arm 25 is lifted up and at the same time turned outward of the housing 23 for receding the liquid developer feed nozzle 26 and the wash liquid feed nozzle 27 into the above-mentioned standby position. On the other hand, the support arm 25 is lowered and turned in to hold the developer and wash liquid feed nozzles 26 and 27 in the operative position over and in close proximity of surfaces on the upper side 10a of the substrate 10. In the receded position of the support arm 25, a treated substrate is unloaded from the substrate rotating means 11 and replaced by an untreated substrate, whenever necessary, by suitable handling means in a manner known in the art. When shifted into the operative position, the developer feed nozzle 26 on the support arm 25 is located immediately above the center of rotation of the substrate 10 to supply a liquid developer onto a center region of the latter.

Figure 5:
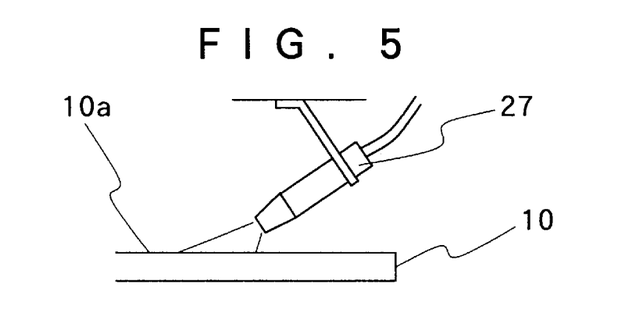
FIG. 5 is a schematic view of a wash liquid feed means.
Figure 6:
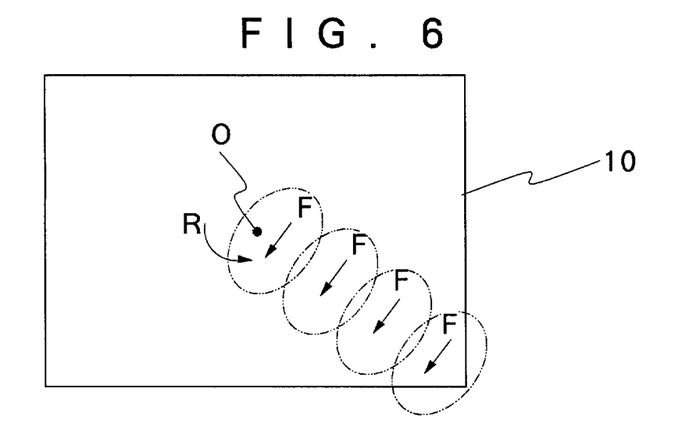
FIG. 6 is a diagrammatic illustration of sprayed wash liquid on a substrate.

On the other hand, as shown in FIGS. 5 and 6, the wash liquid feed nozzles 27 are located in a number of spaced positions on the support arm 25 such that sprays of wash liquid from the respective nozzles 27 are partially overlapped with each other and uniformly spread on the entire surfaces of the substrate 10 from the rotational center O toward four corner portions E. Besides, the nozzles 27 are arranged to spray the wash liquid from oblique angles, namely, from an oblique direction R relative to the direction of rotation F of the substrate 10 as indicated by arrows in FIG. 6. This makes it possible to prolong the residence time of the wash liquid on the surfaces of the substrate and therefore to wash the entire surfaces of the substrate 10 uniformly in an efficient manner synergistically in cooperation with the action of applied ultrasonic waves.

Figure 7:
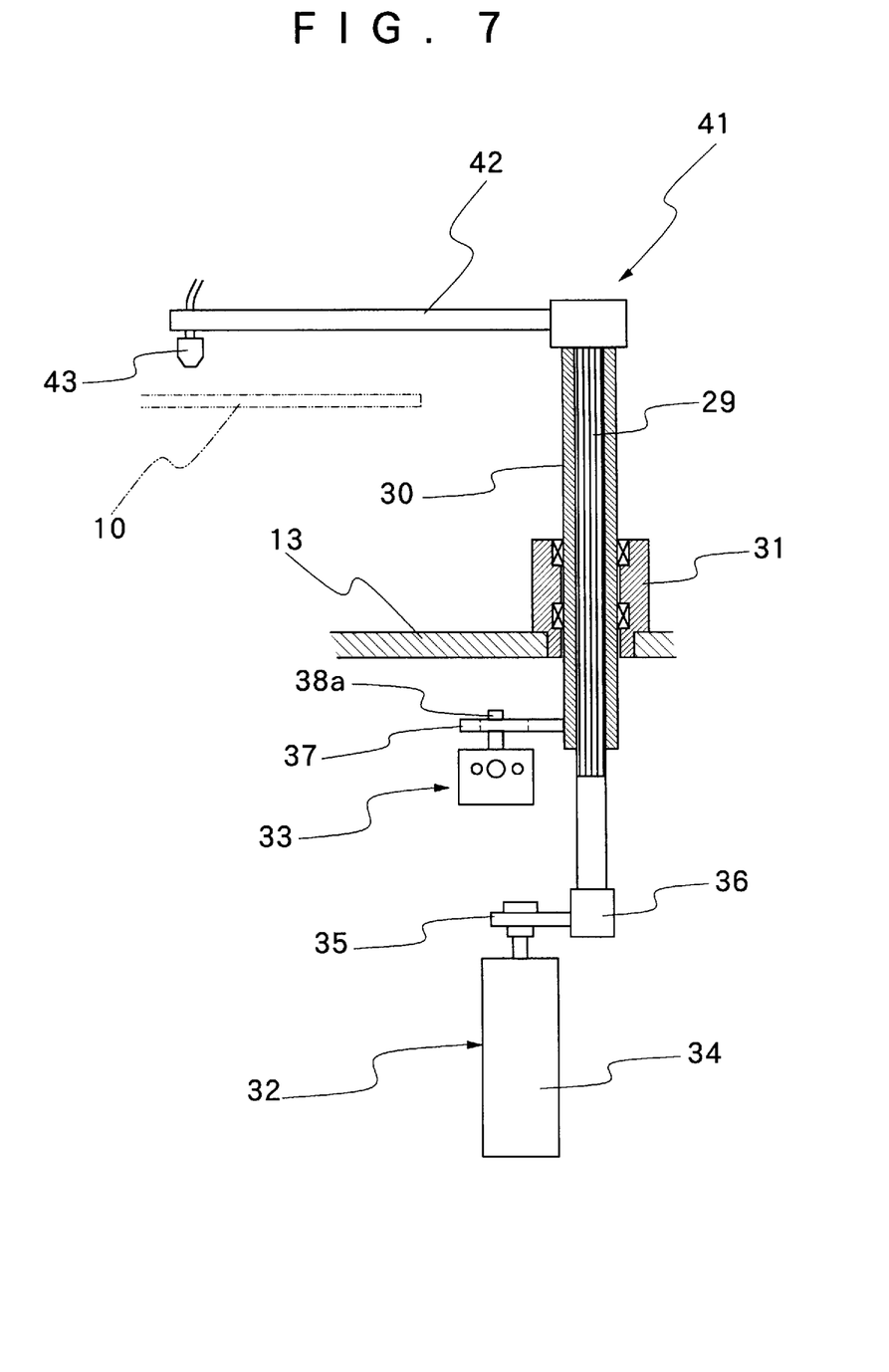
FIG. 7 is a sectional view of a second feed means.

Indicated at 41 is the second feed means which is used for supplying nitrogen gas in this particular embodiment, and which is arranged substantially in the same manner as the above-described first feed means 24. Therefore, in FIG. 7 which shows the second feed means 41, the component parts common with the first feed means 24 are designated by common reference numerals or characters to avoid repetitions of same explanations. In the case of the second feed means 41, a nitrogen gas feed nozzle 43 is mounted on a fore end portion of a support arm 42 which is movable to locate the nitrogen gas feed nozzle 43 in an operative position over the center of rotation of the substrate 10 to supply nitrogen gas thereto as a dry gas.

Thus, relative to the substrate 10 which is placed on the arms 16 of the substrate rotating means 11, firstly the support arms 25 and 43 of the first and second feed means 24 and 42 are located in operative and receded standby positions, respectively, starting to supply a liquid developer toward the rotational center on the upper side 10a of the substrate 10 from the nozzle 26 as soon as the rotational shaft 12 reaches a predetermined rotational speed. Although the circumferential velocity of the substrate 10 is zero at the center of rotation, the supplied liquid developer is spread toward peripheral areas of the substrate 10 and, under the influence of centrifugal force resulting from rotation of the substrate 10, coated on its entire upper surfaces in the form of a film of uniform thickness even in peripheral areas of the substrate 10.

Succeedingly to the application of a liquid developer, the substrate 10 which is continuedly put in rotation is washed in megasonic shower, that is, in the shower of ultrasonically activated wash liquid or pure water which is sprayed from the nozzles 43. In this washing stage, the wash liquid is sprayed on the substrate 10 at a plural number of positions including the center of rotation and in overlapping relations with each other as mentioned hereinbefore, so that the wash liquid can be supplied onto the substrate in a sufficient amount even in peripheral regions which are in rotation at higher circumferential speeds. As a result, the entire surfaces on the front side 10a of the substrate 10 are washed uniformly. Upon completion of the washing treatment, the spraying operation by the wash liquid feed nozzles 43 is stopped.

Following the application of a liquid developer and the washing treatment, the substrate 10 is dried by spin drying, in which the first feed means 24 is receded into the standby position, and instead the second feed means 41 is actuated to lower and turn the support arm 42 into the operative position. In this state, the substrate 10 is put in high speed rotation, whereupon the wash liquid which has deposited on surfaces of the substrate 10 is pushed radially outward by the centrifugal force and scattered away from peripheral edges of the substrate 10. At this time, the centrifugal force normally would not act on wash liquid residues which may exist in surface regions at the center of rotation of the substrate 10. Nevertheless, by the blasts of nitrogen gas which is spurted under a predetermined pressure from the nitrogen gas feed nozzle 43 which is located face to face with the rotational center of the substrate 10 as described above, the wash liquid in center regions of the substrate 10 is pushed into outer regions, which are subject to the influence of centrifugal force, and therefore scattered away from outer edges of the substrate 10 by the centrifugal force. As a result, the entire surfaces of the substrate are dried uniformly. At this time, for the purpose of removing the wash liquid more smoothly and promptly from substrate surfaces in rotationally center regions, the nitrogen feed nozzle 43 may be oscillated through a predetermined angle across the center of rotation of the substrate 10.

As explained hereinbefore, the supplied liquid developer is spread and uniformly coated on the upper surfaces of the substrate 10 under the influence of centrifugal force, while excess liquid developer is shaken off at the outer edges of the substrate 10. Similarly, in the washing treatment, the supplied wash liquid is shaken off by the centrifugal force. Therefore, in order to recover the scattered developer and wash liquid, the processing apparatus is enclosed by the housing 23 which constitutes a processing vessel. Contiguously around the circumference of a bottom wall 23$a$, the housing 23 is provided with upright outer and peripheral walls 23$b$ and 23$c$, each with an inwardly bent top end. A developer collecting chamber 44 is formed between the outer and inner peripheral walls 23$b$ and 23$c$ of the housing 23, while a wash liquid collecting chamber 45 is formed on the inner side of the inner peripheral wall 23$c$. The upper ends of the outer and inner peripheral walls 23$b$ and 23$c$ are each bent substantially into a horizontal direction, leaving on the top side of the housing 23 an opening of a diameter which is at least greater than diagonal length of the substrate 10 to permit loading and unloading of substrates therethrough. The bottom wall 23$a$ which circumvents the cylindrical retainer 14 is sloped upward toward a cylindrical riser wall portion 23$d$ which is provided at the center of the bottom wall 23 around the circumference of the retainer 14. Namely, the bottom wall 23$a$ is sloped downward toward the inner and outer peripheral walls 23$c$ and 23$b$ which stand either in a vertically upright position or in a inwardly inclined state. Accordingly, splashes of the developer and wash liquid, which scatter in the direction of the developer collecting chamber 44 and wash liquid collecting chamber 45, are caught by the upright or inclined surfaces of the outer or inner peripheral wall and allowed to flow down toward the bottom of the collecting chamber 44 or 45. At the respective bottom ends, the developer collecting chamber 44 and wash liquid collecting chamber 45 are connected with suction pipes 46 and 47, either at one predetermined position or at a plural number of positions in the circumferential direction. These suction pipes 46 and 47 are connected to recovery tanks 50 and 51 through vacuum pumps 48 and 49, respectively.

Accordingly, during application of a liquid developer, the substrate 10 is positioned at a level between the outer peripheral wall 23$b$ and the inner peripheral wall 23$c$, and the vacuum pump 48 is actuated to draw the spatters of excess liquid developer, which is shaken off at the outer peripheral edges of the substrate 10, into the developer collecting chamber 44, and recover the collected developer within the chamber 44 into the tank 50 by the suction force of the vacuum pump 48. Similarly, spatters of the wash liquid which occur during a washing treatment can be collected in the wash liquid collecting chamber 45. For this purpose, the housing 23 is lifted into an upper position prior to actuating the vacuum pump 49. By so doing, splashes of wash liquid from the substrate 10 are drawn into the wash liquid collecting chamber 45 and recovered into the tank 51 through the suction pipe 47.

Figure 8:
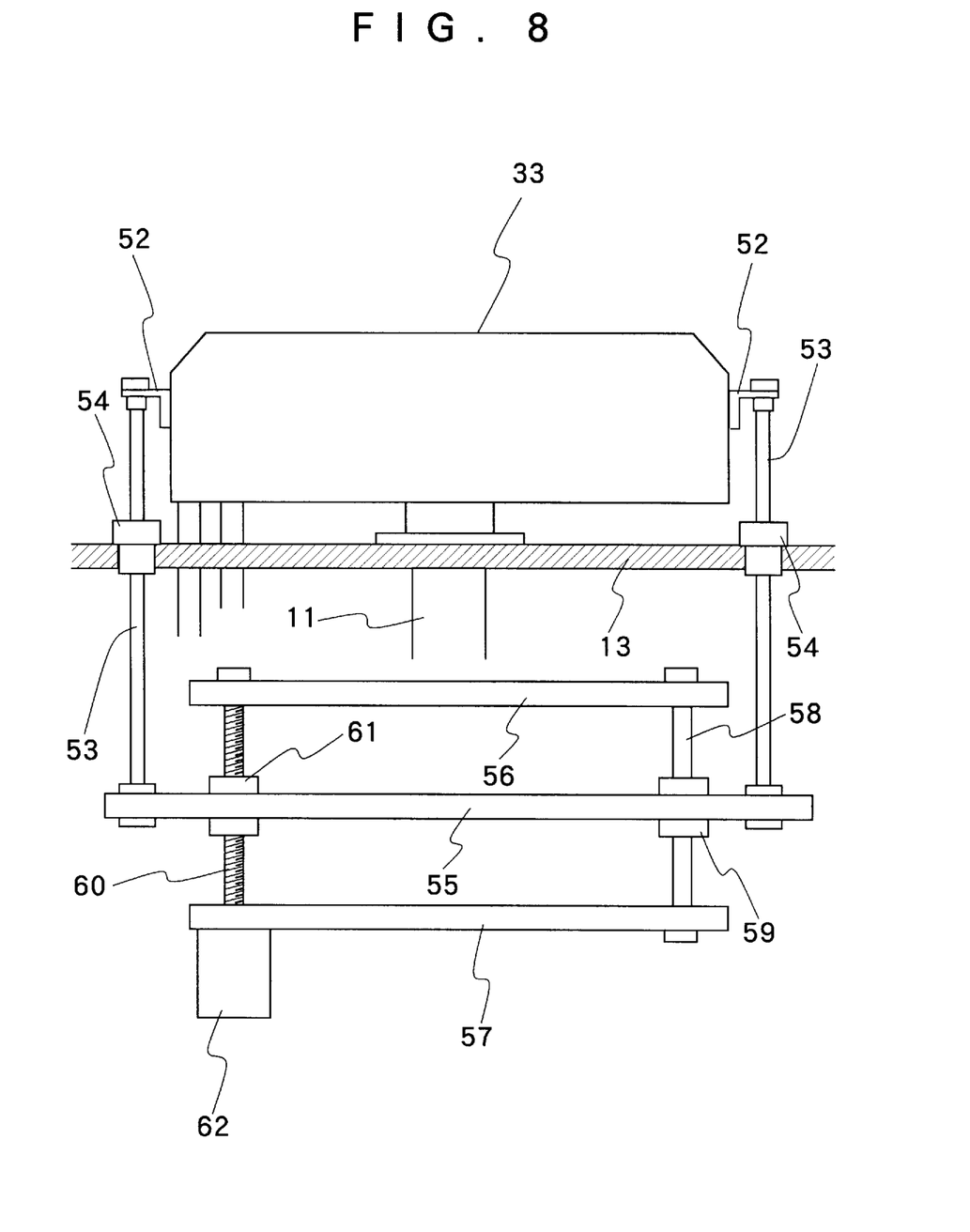
FIG. 8 is a schematic view of a housing lift mechanism.

For the reasons as explained above, the housing 23 is vertically movably supported on the base table. More specifically, for lifting the housing 23 up and down, it is supported on lifting rods 53 through brackets 52 which are securely fixed at opposite sides of the housing 23 as shown particularly in FIG. 8. The lifting rods 53 are extended downward through bearings 54 which are mounted on the base table 13, and fixedly connected to a lift plate 55 at the respective lower ends. The lift plate 55 which is bridged between the lower ends of the lifting rods 53 is mounted on a feed screw mechanism, namely, on a guide rod 58 and a feed screw 60 of a feed screw mechanism. The guide rod 58 and feed screw 60 are extended between lower and upper fixed plates 55 and 56 which are located on the lower and upper sides of the lift plate 54. Further, the guide rod 58 and feed screw 60 are engaged with a slide member 59 and a nut 61, respectively, which are mounted on the lift plate 55. The feed screw 60 is coupled with a drive motor 62 at its lower end. Accordingly, upon actuating the drive motor 62 to rotate the feed screw 60, the lift plate 55 is moved up and down, lifting the housing 23 up and down through the lifting rods 53 between an upper position on a level with the developer collecting chamber 44 and a lower position on a level with the wash liquid collecting chamber 45.

In the stage of coating a liquid developer, as mentioned hereinbefore, excess amounts of liquid developer are shaken off at the outer peripheral edges of the substrate 10 under the influence of centrifugal force and scattered liquid developer is collected into the developer collecting chamber 44. At this time, however, all of excess developer is not necessarily collected completely in the developer collecting chamber 44. Because it is inevitable that part of liquid developer tend to get around and deposit on the back side 10$b$ of the substrate 10, for example, after floating in the form of mist within the housing 23. Deposition of the liquid developer on the back side 10$b$ of the substrate, even in a slight amount, could detrimentally impair the quality of TFT substrates. Accordingly, in processing substrates of this sort, it is a paramount requisite to prevent the liquid developer from getting back to deposit on the back side 10$a$ of the substrate.

Besides, in the stage of washing treatment, the back side 10$a$ of the substrate also gets wet with the wash liquid, let alone the front or upper side 10$a$ on which the wash liquid is poured for washing purposes. As the substrate 10 is put in high speed spin, the centrifugal force acts not only on the front side 10$a$ of the substrate 10 but on the back side 10$b$, which therefore simultaneously undergoes the spin drying. However, even on the back side 10$b$, the substrate 10 remains undried at the center of rotation where the circumferential speed is substantially zero. Of course, sooner or later wash liquid residues in center regions will be dried off. However, differences in drying time often result in spot-like stains on the surface of the substrate. Therefore, the substrate 10 should be dried uniformly even on its back side to obtain spotless clean surfaces.

Further, in the stage of spin drying, the wash liquid depositing on the surfaces of the substrate 10 is dissipated under the influence of centrifugal force, which however contributes to the generation of mist within the wash liquid collecting chamber 45 by causing the liquid to hit vigorously against the inner peripheral wall 23$c$ of the housing 23. In this regard, while the substrate 10 is put in high speed rotation, drafts of air are induced as a result of the rotation of the substrate 10 within a narrow limited space confined by the back side 10$b$ of the substrate 10 and the inner peripheral wall 23$c$ and bottom wall 23$a$ of the housing 23. More specifically, there occur outward drafts of air from the center of rotation, and as a result vacuum pressure is developed in the vicinity of the center of rotation on the back side of the substrate 10, giving rise to circulation of air as indicated by arrow S in FIG. 1. The air circulation of this nature is very likely to cause redeposition of mist, leaving spot-like stains on surfaces on the back side 10b of the substrate 10 which were once dried by the spin drying. Therefore, it is also necessary to suppress air circulations within the wash liquid collecting chamber 45.

Figure 9:
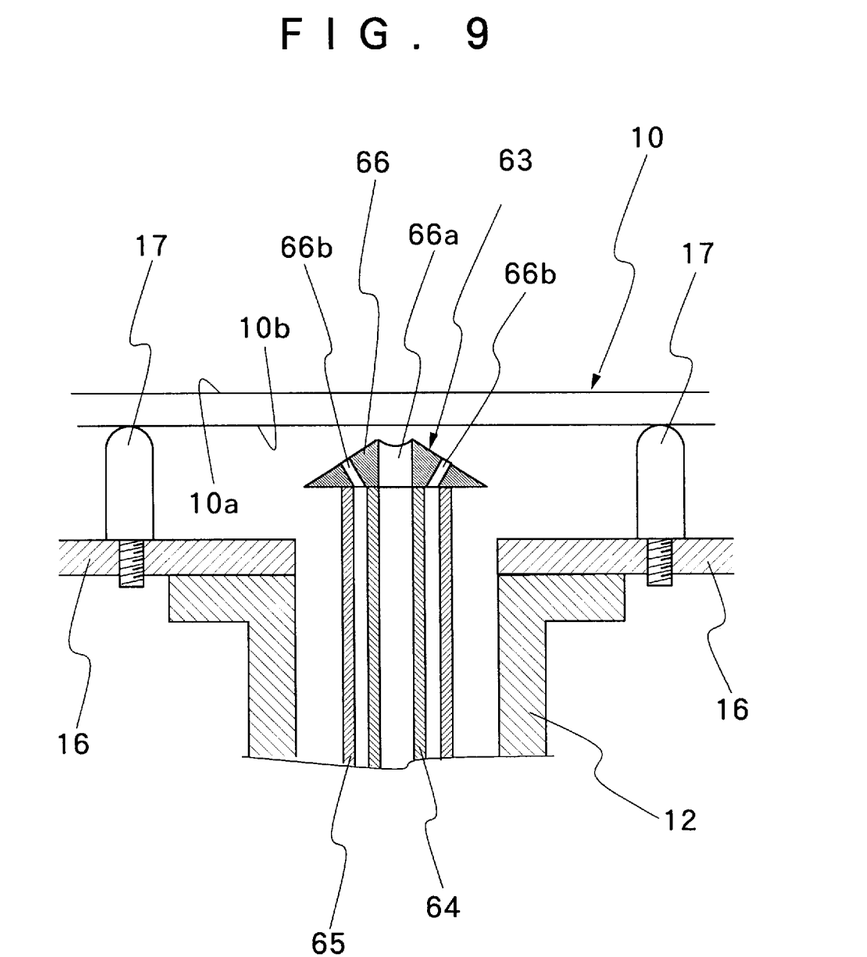
FIG. 9 is a sectional view of a fore end portion of a nozzle means.
Figure 10:
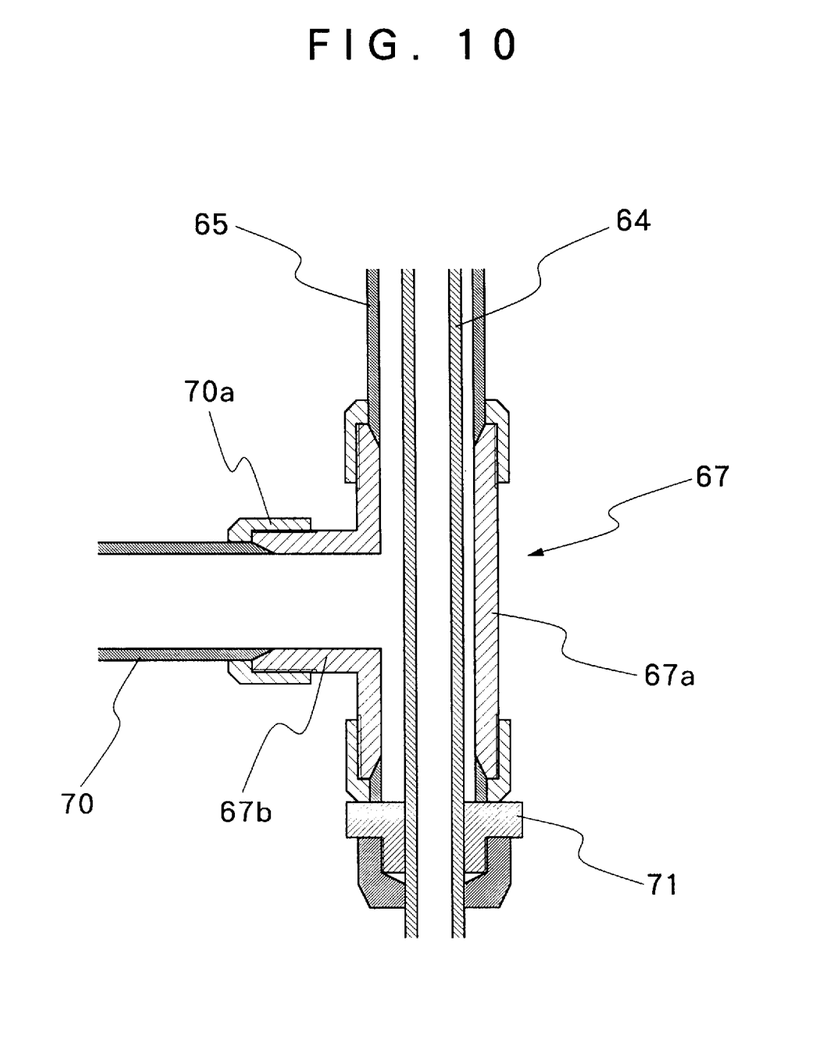
FIG. 10 is a sectional view of a branch passage of the nozzle means.

In consideration of these points, the rotational shaft 12 which rotates the substrate 10 is constituted by a hollow shaft with an internal cavity to receive nozzle means 63 therein. The nozzle means 63 is arranged to include feed passages for pure water to be applied to form a protective water film on the back side 10b of the substrate 10 and nitrogen gas to be applied as a drying gas. More particularly, in order to supply pure water and nitrogen gas through separate feed passages, the nozzle means 63 is arranged in a double tube construction as shown in FIGS. 9 and 10, including an inner tube 64 for supplying nitrogen gas and an outer tube 65 for supplying pure water. A nozzle tip 66 substantially of conical shape is capped on the upper end of the double tube body of the nozzle means 63. The nozzle tip 66 is provided with a central nozzle hole 66a which is in communication with the inner tube 64 and opened toward the center of rotation on the back side 10b of the substrate 10 to blast nitrogen gas thereto, and a plural number of outer nozzle holes 66b which are bored around the central nozzle hole 66a in communication with the outer tube 65 and at a predetermined angle with the longitudinal axis of the latter for spurting pure water against the back side 10b of the substrate 10 in an upwardly diverging fashion.

The nozzle means 63 has a T-joint 67 connected to the lower end of the outer tube 65, which is terminated short of the lower end of the inner tube 64, in such a way that the inner tube 64 is passed through a straight pipe portion 67a of the T-joint 67 for connection to a nitrogen gas source 68. The outer tube 65 is provided with a coupling portion 65a at its lower end for threaded engagement with one end of the straight pipe portion 67a of the T-joint 67. A branch pipe portion 67b is projected from the straight pipe portion 67a at right angles with the latter. The branch pipe portion 67b of the T-joint 67 is threaded into a coupling member 70a which connects the branch pipe portion 67b with a pure water feed pipe 70 from a pure water source 69. The other or lower end of the straight pipe portion 67a of the T-joint 67 is threaded on an annular plug member 71 which seals the lower end of the annular passage between the T-joint 67 and the inner tube 64. Accordingly, by controlling valve mechanisms of the nitrogen gas supply source 68 and pure water supply source 69, the respective treating liquids are supplied to the inner and outer tubes 64 and 65 of the nozzle means 63.

In the stage of applying a liquid developer, simultaneously with starting rotation of the rotational shaft 12 or at the latest simultaneously with starting supply of a liquid developer to the developer feed nozzle 17, pure water is supplied to the outer tube 65 of the nozzle means 63 within the rotational shaft 12 to spurt pure water out of the nozzle holes 66b of the nozzle tip 66. Since pure water is sprinkled on the back side 10b of the substrate 10 in obliquely diverging directions, it is urged to propagate in radially outward directions along the lower surfaces of the substrate under the influence of centrifugal force, forming a protective film of pure water on the entire surfaces on the back side 10b of the substrate 10 to protect same against deposition of the liquid developer or its mist. More specifically, the protective liquid film of pure water is formed only in those regions which are under the influence of centrifugal force, that is to say, central regions on the back side 10b of the substrate 10 remain free of pure water because no water is supplied thereto while the rotation of the substrate itself prevents sprinkled water from flowing toward surface regions at or around the center of rotation. Besides, there is almost no possibility of the liquid developer getting as far as the center regions on the back side 10b of the substrate through a water curtain which is formed between the nozzle holes 66b and the lower side of the substrate 10. In the washing stage, it is not necessarily required to supply pure water to the back side 10b of the substrate 10, but if desired pure water may be spurted toward the back side 10b for the purpose of enhancing the efficiency of the washing treatment.

Further, in the stage of high-speed spin drying, in addition to the front side 10a, nitrogen gas may also be blasted on the back side 10b of the substrate 10 from the nozzle means 63 to relocate wash liquid residues in rotationally center regions forcibly away from the center of rotation into outer regions where the wash liquid is subjected to the centrifugal force. In this regard, the nozzle means 63 of double tube construction can be switched to change its operation to the supply of nitrogen gas instead of pure water of the previous stage of processing, without giving rise to the trouble of nitrogen gas mixing into pure water as experienced when a single feed passage is used for both pure water and nitrogen gas. In the case of the double tube nozzle means 63, the outer and inner tubes 65 and 64 provide independent feed passages for pure water and nitrogen gas, so that it can be switched to stop supply of pure water immediately whenever necessary, and start feeding dry and moisture-free nitrogen gas to the nozzle tip 66. Besides, the nozzle hole 66a on the nozzle tip 66 is directed exactly toward the center of rotation of the substrate 10, sending out blasts of nitrogen gas thereby to push residual liquid in center regions of the substrate 10 forcibly into outer regions which are under the influence of centrifugal force. The use of T-joint 67 contributes to provide a considerably simplified fluid distribution system with separate and independent supply passages for pure water and nitrogen gas.

Further, in order to prevent mist of the wash liquid from depositing on the back side 10b of the substrate 10 after being entrained on and carried by air flows which are generated in the stage of high-speed spin drying, it is necessary to preclude development of vacuum pressures in the regions in the vicinity of the center of rotation of the substrate 10. For this purpose, dry air feed nozzles 72 are located in a plural number of positions around the cylindrical riser portion 23d at the center of the bottom wall 23 of the housing 23. The dry air feed nozzles 72 are hooked substantially in U-shape at the respective upper ends, that is to say, spout ends of the nozzles 72 are turned in a direction away from the back side 10b of the substrate 10 to spurt dry air in counterflow to air flows which take place toward the back side 10b while the substrate 10 is in rotation. Thanks to dry air which is spurted from the dry air feed nozzles 72 in this manner, it becomes possible to prevent development of vacuum pressures in regions in the vicinity of the center of rotation on the back side 10b of the substrate 10, and therefore to prevent mist of a treating liquid prevailing in the wash liquid collecting chamber 45 from depositing on the back side 10b of the substrate 10, in an assured manner.

What is claimed is:

1. A substrate processing apparatus, comprising;
   a substrate rotating means arranged to hold and rotate a substrate in a horizontal face-up position;
   a treating liquid feed means having a treating liquid feed nozzle member for supplying at least one kind of treating liquid onto upper surfaces of said substrate being rotated by said substrate rotating means, said treating liquid feed nozzle member being supported on a movable arm for displacement to and from an operative position vertically confronting said substrate and a receded standby position away from said substrate on said substrate rotating means; and a nozzle means for supplying a fluid to lower surfaces of said substrate.

2. A substrate processing apparatus as defined in claim 1, wherein said treating liquid is at least one member selected from the group consisting of developing agent, etching agent and release or peeling agent.

3. A substrate processing apparatus as defined in claim 1, further comprising a dry gas feed means for supplying a dry gas toward upper surfaces of said substrate at the center of rotation thereof, said dry gas feed means being supported on a movable arm for displacement to and from an operative position vertically confronting said substrate and a receded standby position away from said substrate on said substrate rotating means.

4. A substrate processing apparatus as defined in claim 3, wherein said dry gas feed means is arranged to oscillate along locus of movement passing through the center of rotation of said substrate.

5. A substrate processing apparatus as defined in claim 1, wherein said treating liquid feed means comprises a first feed means for supplying at least one treating liquid selected from the group consisting of developing agent, etching agent and release agent, and a second feed means for supplying a dry gas.

6. A substrate processing apparatus as defined in claim 5, wherein said first feed means is provided with a support arm carrying a treating liquid feed nozzle member for pouring a treating liquid on upper surfaces of said substrate at the center of rotation thereof along with a plural number of wash liquid feed nozzle members for sprinkling a wash liquid on upper surfaces of said substrate over a wide range covering from said center of rotation to outer peripheral regions of said upper surfaces.

7. A substrate processing apparatus as defined in claim 6, wherein said second feed means is provided with a support arm carrying a dry gas feed nozzle for blasting a dry gas on upper surfaces of said substrate at the center of rotation thereof.

8. A substrate processing apparatus as defined in claim 5, further comprising a housing arranged to circumvent said substrate on said substrate rotating means and defining a treating liquid collecting space around said substrate.

9. A substrate processing apparatus as defined in claim 8, wherein said housing is arranged to define a plural number of chambers around said substrate for separately collecting different kinds of treating liquids, said housing being supported on a lift means and thereby lifted up and down to bring inlet openings of said chambers substantially in level with said substrate on said substrate rotating means.

10. A substrate processing apparatus as defined in claim 9, wherein each one of said chambers is connected to a suction means for drawing out a collected treating liquid.

11. A substrate processing apparatus as defined in claim 1, wherein said nozzle means is of multi-channel pipe construction having coaxial inner and outer tubes providing separate feed passages for a dry gas and pure water, respectively.

12. A substrate processing apparatus as defined in claim 11, wherein said inner tube is in communication with a central nozzle hole of a nozzle tip targeted at the center of rotation on the lower side of said substrate, and said outer tube is in communication with outer nozzle holes opened around said central nozzle hole of said nozzle tip, said nozzle means sprinkling pure water on the lower side of said substrate from said outer tube to form a protective liquid film thereon while a treating liquid is being fed to upper surfaces of said substrate from said treating liquid feed means, and blasting a dry gas on the lower side of said substrate from said inner tube in the stage of spin-drying treatment for drying the upper and lower sides of said substrate simultaneously while being rotated for said spin drying treatment.

13. A substrate processing apparatus as defined in claim 1, further comprising dry air feed nozzle for feeding dry air to the center of rotation on the lower side of said substrate to prevent development of vacuum pressures in the vicinity of said center of rotation when said substrate is put in rotation by said substrate rotating means.

14. A substrate processing apparatus as defined in claim 13, wherein said dry air feed nozzle is opened in a direction away from said lower side of said substrate.

15. A substrate processing apparatus as defined in claim 11, wherein said nozzle means comprises a T-joint diverging said feed passage of said inner tube from said feed passage of said outer tube.

16. A method for processing a substrate, comprising the steps of:

holding and putting a substrate in rotation in a horizontal face-up position on a vertical rotational shaft;

feeding a treating liquid to upper surfaces of the rotating substrate at the center of rotation thereof to coat said treating liquid in a film of a uniform thickness over the entire upper surfaces of said substrate, while feeding pure water to lower surfaces of said substrate at or in the vicinity of said center of rotation to form a protective water film on the lower side of said substrate under the influence of centrifugal force;

feeding pure water to upper surfaces of said rotating substrate to wash coated film of said treating liquid; and spin-drying said substrate by blasting a dry gas on both upper and lower surfaces of said rotating substrate at the center of rotation of thereof.

* * * * *